United States Patent
Kim (10) Patent No.: US 9,825,227 B2
(45) Date of Patent: Nov. 21, 2017

(54) FILLING FILM AND METHOD OF MANUFACTURING ORGANIC LIGHT-EMITTING DISPLAY APPARATUS BY USING THE SAME

(71) Applicant: Samsung Display Co., Ltd., Yongin (KR)

(72) Inventor: Jeong-Su Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 120 days.

(21) Appl. No.: 13/974,802

(22) Filed: Aug. 23, 2013

(65) Prior Publication Data
US 2014/0345796 A1 Nov. 27, 2014

(30) Foreign Application Priority Data
May 22, 2013 (KR) .......................... 10-2013-0057953

(51) Int. Cl.
*B32B 7/02* (2006.01)
*B32B 7/04* (2006.01)
(Continued)

(52) U.S. Cl.
CPC ............ *H01L 51/0024* (2013.01); *B32B 7/06* (2013.01); *H01L 51/5246* (2013.01); *H01L 51/56* (2013.01); *B29C 65/00* (2013.01); *B29C 65/48* (2013.01); *B29C 65/50* (2013.01); *B29C 65/5007* (2013.01); *B29C 65/5057* (2013.01); *B29C 66/40* (2013.01); *B29C 66/41* (2013.01);
(Continued)

(58) Field of Classification Search
None
See application file for complete search history.

(56) References Cited

U.S. PATENT DOCUMENTS 3,769,137 A * 10/1973 Moriyama ............. B32B 27/00
156/199
5,691,022 A * 11/1997 Knauf .................... C09J 7/0228
283/81
(Continued)

FOREIGN PATENT DOCUMENTS

EP 1995288 11/2008
EP 2039506 3/2009
(Continued)

OTHER PUBLICATIONS

"ASTM D903—Standard Test Method for Peel or Stripping Strength of Adhesive Bonds" (Apr. 2004).*
(Continued)

*Primary Examiner* — Vivian Chen
(74) *Attorney, Agent, or Firm* — H.C. Park & Associates, PLC (57) ABSTRACT

Provided are a filling film and a method of manufacturing an organic light-emitting display apparatus by using the filling film. The filling film includes a filling material, a first releasing film attached to a surface of the filling film, a second releasing film attached to another surface of the filling film, and a supporting layer attached to the second releasing film. The bonding force between the second releasing film and the supporting layer is greater than the bonding force between the filling material and the second releasing film.

7 Claims, 4 Drawing Sheets

(51) Int. Cl.
  *B32B 7/06* (2006.01)
  *B32B 7/12* (2006.01)
  *B32B 27/32* (2006.01)
  *B32B 27/36* (2006.01)
  *C09J 7/02* (2006.01)
  *B29C 65/00* (2006.01)
  *B29C 65/48* (2006.01)
  *B29C 65/50* (2006.01)
  *H01L 51/00* (2006.01)
  *H01L 51/52* (2006.01)
  *H01L 51/56* (2006.01)
  *C09J 7/04* (2006.01)

(52) U.S. Cl.
  CPC ........... *B29C 66/45* (2013.01); *B29C 66/47* (2013.01); *B29C 66/472* (2013.01); *B32B 7/02* (2013.01); *B32B 7/04* (2013.01); *B32B 7/12* (2013.01); *B32B 27/32* (2013.01); *B32B 27/322* (2013.01); *B32B 27/36* (2013.01); *B32B 2250/04* (2013.01); *B32B 2307/21* (2013.01); *B32B 2307/748* (2013.01); *B32B 2323/00* (2013.01); *B32B 2323/10* (2013.01); *B32B 2327/18* (2013.01); *B32B 2367/00* (2013.01); *B32B 2457/20* (2013.01); *C09J 7/02* (2013.01); *C09J 7/025* (2013.01); *C09J 7/0225* (2013.01); *C09J 7/0228* (2013.01); *C09J 7/0232* (2013.01); *C09J 7/0239* (2013.01); *C09J 7/046* (2013.01); *C09J 2423/005* (2013.01); *C09J 2423/105* (2013.01); *C09J 2427/005* (2013.01); *C09J 2467/005* (2013.01); *Y10T 428/14* (2015.01); *Y10T 428/1424* (2015.01); *Y10T 428/1429* (2015.01); *Y10T 428/1452* (2015.01); *Y10T 428/2495* (2015.01); *Y10T 428/266* (2015.01); *Y10T 428/3154* (2015.04); *Y10T 428/31504* (2015.04); *Y10T 428/31544* (2015.04); *Y10T 428/31786* (2015.04); *Y10T 428/31938* (2015.04)

(56) References Cited

U.S. PATENT DOCUMENTS

| | | | | |
|---|---|---|---|---|
| 5,817,386 A * | 10/1998 | Adamko | ............... | B32B 27/32 428/41.3 |
| 6,020,412 A * | 2/2000 | Muschelewicz | ..... | C09D 183/04 524/296 |
| 6,210,767 B1 * | 4/2001 | Knauf | ................ | C09J 7/0228 428/314.2 |
| 6,287,661 B1 * | 9/2001 | Shigetomi | ................ | G09F 3/10 369/275.1 |
| 6,299,945 B1 * | 10/2001 | Mertz | ................ | C09D 183/06 427/208 |
| 6,365,254 B1 * | 4/2002 | Zoller | ................ | B32B 7/06 428/212 |
| 6,368,722 B1 * | 4/2002 | Mimura | ................ | C08J 7/047 427/129 |
| 6,395,360 B1 * | 5/2002 | Takahira | ................ | B32B 27/32 428/352 |
| 6,506,489 B1 * | 1/2003 | Ohura | ................ | B32B 27/32 428/208 |
| 6,521,312 B1 * | 2/2003 | Keiser | ................ | B32B 27/08 428/213 |
| 6,652,943 B2 * | 11/2003 | Tukachinsky | ............ | B32B 1/02 428/36.91 |
| 7,648,608 B2 * | 1/2010 | Guenter | ................ | B32B 7/06 156/242 |
| 7,744,715 B2 * | 6/2010 | Nishio | ................ | B29C 47/06 156/244.11 |
| 2003/0077442 A1 * | 4/2003 | Inokuchi | ................ | B32B 7/06 428/352 |
| 2003/0091817 A1 * | 5/2003 | Amano | ............... | B29C 47/0021 428/343 |
| 2003/0104200 A1 * | 6/2003 | Holguin | ................ | C08F 20/22 428/355 R |
| 2003/0117790 A1 * | 6/2003 | Lee | ................ | G02B 6/0043 362/617 |
| 2004/0157992 A1 * | 8/2004 | Uwada et al. | ................ | 525/69 |
| 2005/0227082 A1 * | 10/2005 | Shimazu et al. | ............. | 428/413 |
| 2005/0227387 A1 * | 10/2005 | Yokajty et al. | ............. | 438/22 |
| 2005/0266195 A1 * | 12/2005 | Nonaka | ................ | C09J 7/0217 428/40.1 |
| 2006/0100299 A1 * | 5/2006 | Malik et al. | ............. | 522/31 |
| 2007/0087153 A1 * | 4/2007 | Port | ................ | B32B 7/06 428/40.1 |
| 2007/0148485 A1 * | 6/2007 | Kusama | ................ | C09J 133/08 428/520 |
| 2007/0236618 A1 * | 10/2007 | Maag | ................ | G06F 3/041 349/12 |
| 2007/0292650 A1 * | 12/2007 | Suzuki | ................ | C09J 7/0207 428/41.8 |
| 2008/0280086 A1 * | 11/2008 | Sheridan et al. | ............. | 428/40.7 |
| 2008/0299347 A1 * | 12/2008 | Ukei | ................ | B29C 47/0021 428/41.8 |
| 2009/0117395 A1 * | 5/2009 | Yakushidoh | ............ | B32B 27/36 428/458 |
| 2009/0229733 A1 * | 9/2009 | Kishioka | ................ | C09D 133/08 156/60 |
| 2009/0258176 A1 * | 10/2009 | Muta | ................ | B32B 27/08 428/41.5 |
| 2009/0258225 A1 * | 10/2009 | Nishida et al. | ................ | 428/352 |
| 2010/0055371 A1 * | 3/2010 | Edwards | ................ | B32B 7/06 428/41.6 |
| 2010/0178496 A1 * | 7/2010 | Masuda | ................ | C09J 7/00 428/347 |
| 2010/0209649 A1 * | 8/2010 | Kuwahara | ................ | B32B 7/06 428/41.3 |
| 2010/0215881 A1 * | 8/2010 | Miyata et al. | ............... | 428/41.3 |
| 2010/0297406 A1 * | 11/2010 | Schaffer | ................ | C08F 293/005 428/195.1 |
| 2011/0003092 A1 * | 1/2011 | Lovgren | ................ | G02B 1/04 428/1.32 |
| 2011/0235327 A1 * | 9/2011 | Sasaki | ................ | 362/249.01 |
| 2011/0306263 A1 | 12/2011 | Nakazono et al. | | |
| 2012/0009399 A1 * | 1/2012 | Nonaka | ................ | B32B 7/10 428/214 |
| 2012/0100326 A1 * | 4/2012 | Sherman | ................ | C09J 175/16 428/41.8 |
| 2012/0141752 A1 * | 6/2012 | Wu | ................ | B41M 5/267 428/203 |
| 2012/0202055 A1 * | 8/2012 | Kataoka | ................ | C09J 7/0296 428/336 |
| 2012/0241071 A1 * | 9/2012 | Niimi | ................ | B32B 7/06 156/60 |
| 2012/0325402 A1 * | 12/2012 | Suwa et al. | ................ | 156/275.5 |
| 2013/0040093 A1 * | 2/2013 | Horiuchi et al. | ............. | 428/78 |
| 2013/0193477 A1 * | 8/2013 | Katayama et al. | .......... | 257/100 |
| 2013/0211028 A1 * | 8/2013 | Shinike | ................ | G06F 3/044 526/307.5 |

FOREIGN PATENT DOCUMENTS

| | | | |
|---|---|---|---|
| JP | 10-020325 | * | 1/1998 |
| JP | 2004224991 | | 8/2004 |
| JP | 2005-17704 | | 1/2005 |
| JP | KR 10-2005-0122302 | * | 12/2005 |
| JP | 2007-42616 | | 2/2007 |
| JP | 2007254743 | | 10/2007 |
| JP | 2009-197150 A | * | 9/2009 |
| JP | 2010-020973 | * | 1/2010 |
| JP | 2010-20973 | | 1/2010 |
| KR | 10-2005-0122302 | | 12/2005 |
| KR | 10-2011-0028836 | | 3/2011 |

(56) References Cited

FOREIGN PATENT DOCUMENTS

KR  10-2012-0045213  5/2012
KR  10-2012-0090819  8/2012

OTHER PUBLICATIONS

"ASTM D952—Standard Test Method for Bond or Cohesive Strength of Sheet Plastics and Electrical Insulating Materials" (Apr. 2002).*
Partial European Search Report issued on Feb. 18, 2015, in European Patent Application No. 14162408.0.
Extended European Search Report dated Jun. 26, 2015, in European Patent Application No. 14162408.0.

* cited by examiner

FILLING FILM AND METHOD OF MANUFACTURING ORGANIC LIGHT-EMITTING DISPLAY APPARATUS BY USING THE SAME

CROSS-REFERENCE TO RELATED PATENT APPLICATION

This application claims the benefit of Korean Patent Application No. 10-2013-0057953, filed on May 22, 2013, in the Korean Intellectual Property Office, the disclosure of which is incorporated herein in its entirety by reference.

BACKGROUND

Field

Exemplary embodiments of the present invention relate to a filling film and a method of manufacturing an organic light-emitting display apparatus by using the same, and more particularly, to a filling film that can increase a manufacturing efficiency of an organic light-emitting display apparatus and a method of manufacturing the organic light-emitting display apparatus by using the same.

Discussion of the Background

Recently, display apparatuses have been replaced by portable thin film flat display apparatuses. Of the flat display apparatuses, a field emission display apparatus is an emissive display apparatus that has wide viewing angles and high contrast, and thus, draws attention as a next generation display apparatus. Also, an organic light-emitting display apparatus, in which a light-emitting layer is formed of an organic material, has desirable characteristics, such as wide viewing angles, high contrast, short response times, and multi-color displays.

An organic light-emitting display apparatus typically includes a substrate on which a display unit is formed and an encapsulating substrate formed on the display unit, and the substrate and the encapsulating substrate are combined with each other by using a sealant. However, due to the trend of increasing the size of the organic light-emitting display apparatus, the size and weight of the encapsulating substrate are also increased. Thus, in order to ensure the structural reliability of the organic light-emitting display apparatus, a method of further including a filling material between the substrate and the encapsulating substrate has been developed.

SUMMARY OF THE INVENTION

Exemplary embodiments of the present invention provide a filling film that can increase a manufacturing efficiency of an organic light-emitting display apparatus and a method of manufacturing the organic light-emitting display apparatus by using the filling film.

An exemplary embodiment of the present invention discloses a filling film. The filling film comprises a filling material, a first releasing film attached to a first surface of the filling material, a second releasing film attached to a second surface of the filling material, and a supporting layer attached to the second releasing film. A bonding force between the second releasing film and the supporting layer is greater than a bonding force between filling material and the second releasing film.

An exemplary embodiment of the present invention also discloses a method of manufacturing a display apparatus. The method includes separating a filling film from a stack in which a plurality of the filling films are stacked, centering the separated filling film on a film stage, laminating a filling material of the filling film on an encapsulation substrate, and combining the encapsulation substrate and a substrate comprising a display unit. Prior to laminating, the filling film comprises a first releasing film attached to a first surface of the filling material, a second releasing film attached to a second surface of the filling material, and a supporting layer attached to the second releasing film, and the supporting layer comprises polyethylene terephthalate and has a thickness in a range from about 50 μm to about 100 μm.

An exemplary embodiment of the present invention also discloses a first releasing film having a first thickness, a filling material disposed on the first releasing film, a second releasing film disposed on the filling material and having a second thickness, the second thickness being less than the first thickness, and a supporting layer disposed on the second releasing film. The supporting layer includes polyethylene terephthalate and has a third thickness greater than the second thickness.

It is to be understood that both the foregoing general description and the following detailed description are exemplary and explanatory and are intended to provide further explanation of the invention as claimed.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE ILLUSTRATED EMBODIMENTS

While exemplary embodiments are capable of various modifications and alternative forms, embodiments thereof are shown by way of example in the drawings and will herein be described in detail. It should be understood, however, that there is no intent to limit exemplary embodiments to the particular forms disclosed, but on the contrary, exemplary embodiments are to cover all modifications, equivalents, and alternatives falling within the scope of the invention. In describing the present invention, when practical descriptions with respect to related known function and configuration may unnecessarily make unclear of the scope of the present invention, the descriptions thereof will be omitted.

It will be understood that, although the terms "first", "second", etc. may be used herein to describe various elements, these elements should not be limited by these terms. These terms are only used to distinguish one element from another.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Hereafter, the present invention will be described more fully with reference to the accompanying drawings, in which exemplary embodiments of the present invention are shown. In describing exemplary embodiments of the present invention with reference to drawings, like reference numerals are used for elements that are substantially identical or correspond to each other, and the descriptions thereof will not be repeated. In the drawings, thicknesses may be magnified for clarity of layers and regions. Also, for convenience of explanation, some of the layers and regions may be exaggerated.

Figure 1:
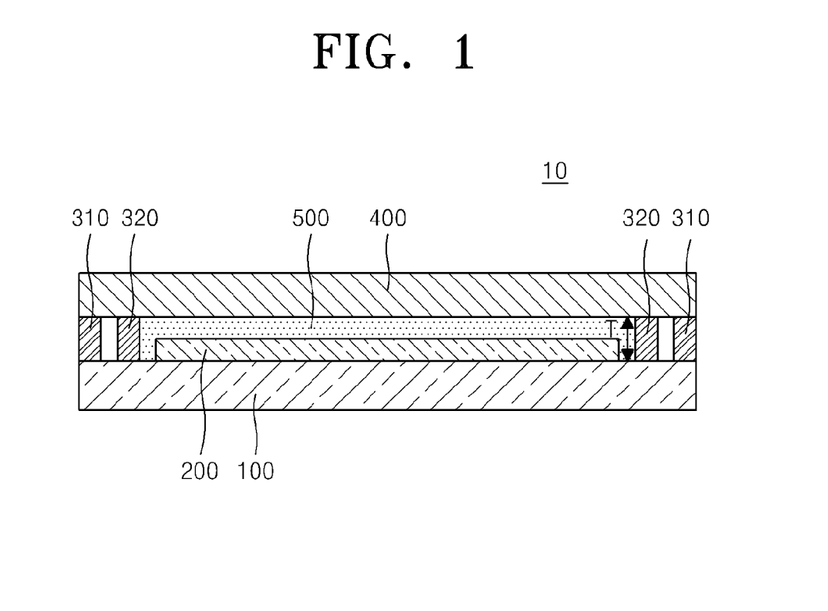
FIG. 1 is a schematic cross-sectional view of an organic light-emitting display apparatus according to an exemplary embodiment of the present invention.
Figure 2:
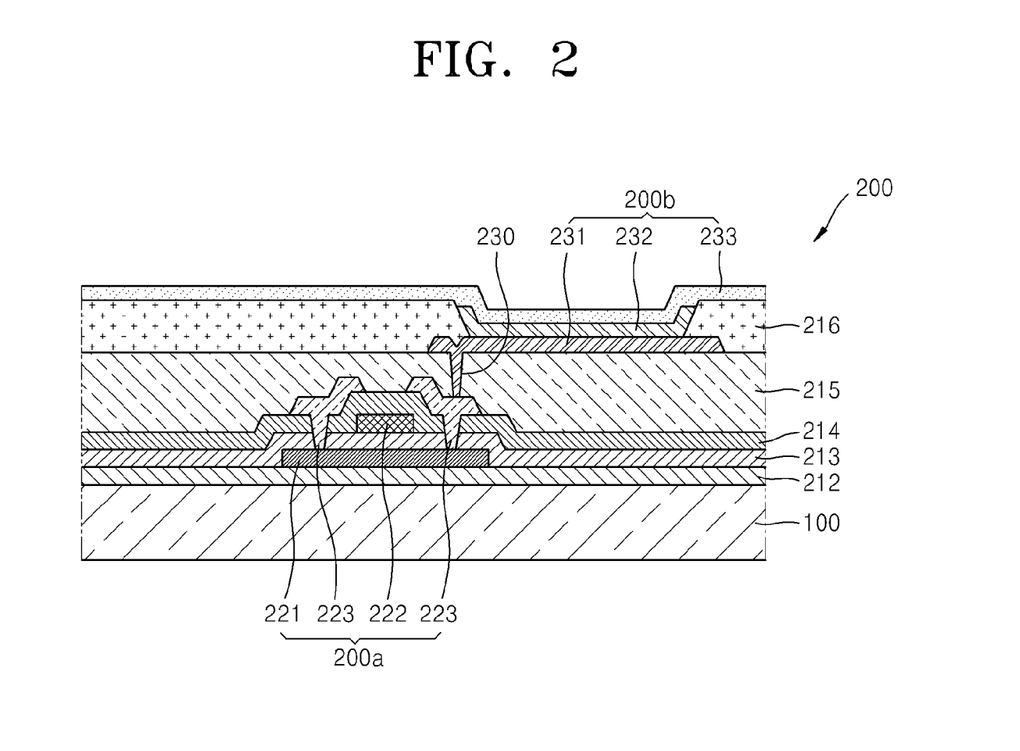
FIG. 2 is a schematic cross-section al view of a display unit of the organic light-emitting display apparatus of FIG. 1.

FIG. 1 is a schematic cross-sectional view of an organic light-emitting display apparatus 10 according to an exemplary embodiment of the present invention. FIG. 2 is a schematic cross-sectional view of a display unit 200 of the organic light-emitting display apparatus 10 of FIG. 1.

Referring to FIGS. 1 and 2, the organic light-emitting display apparatus 10 includes a substrate 100, the display unit 200 formed on the substrate 100, an encapsulation substrate 400 disposed to face the substrate 100, a sealing material 310 that seals the display unit 200 by combining the substrate 100 and the encapsulation substrate 400, and a filling material 500 between the display unit 200 and the encapsulation substrate 400.

The substrate 100 may be formed of a transparent glass material having SiO2 as the main component. However, the substrate 100 may be formed using other materials. For example, the substrate may be formed of a transparent plastic material. The plastic material used to form the substrate 100 may include, for example, at least one insulating organic material such as polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), triacetate (TAC), and cellulose acetate propionate (CAP).

When the organic light-emitting display apparatus 10 is a bottom emission type, in which an image is realized in a direction towards the substrate 100, the substrate 100 is formed of a transparent material. However, when the organic light-emitting display apparatus 10 is a top emission type, in which an image is realized in a direction opposite to the substrate 100, the substrate 100 may be formed of a reflective material, such as a metallic material. When the substrate 100 is formed of a metallic material, the substrate 100 may include, for example, at least one of carbon, iron, chrome, manganese, nickel, titanium, molybdenum, and stainless steel (SUS).

The display unit 200 may include a thin film transistor layer 200a and a pixel unit 200b. The thin film transistor layer 200a may be formed using organic, inorganic, or any other materials that may be used to form thin film transistors. The pixel unit 200b may be an organic light-emitting device (OLED). Hereinafter, the display unit 200 will be described in detail with reference to FIG. 2.

A buffer layer 212 may be formed on the substrate 100. The buffer layer 212 prevents the penetration of impurity elements into the substrate 100 and provides a planarized surface on the substrate 100. The buffer layer 212 may be formed of various materials that perform the functions described above. For example, the buffer layer 212 may include, for example, at least one inorganic material such as silicon oxide, silicon nitride, silicon oxynitride, aluminum oxide, aluminum nitride, titanium oxide, and titanium nitride or at least one organic material such as polyimide, polyester, and acryl, and may be formed as a stack of layers by using the materials described above.

The buffer layer 212 may be deposited by using various methods, for example, a plasma-enhanced chemical vapor deposition (PECVD) method, an atmospheric pressure CVD (APCVD) method, or a low pressure CVD (LPCVD).

An active layer 221 may be formed of an inorganic semiconductor, such as silicon, or an organic semiconductor on the buffer layer 212. Also, the active layer 221 includes a source region, a drain region, and a channel region between the source and drain regions. For example, when the active layer 221 is formed of amorphous silicon, the active layer 221 may be formed such that, after forming an amorphous silicon layer on the whole surface of the buffer layer 212, a polycrystalline silicon layer is formed by crystallizing the amorphous silicon layer. After patterning the polycrystalline silicon layer, the active layer 221 having the source region and the drain region on edges thereof and the channel region between the source region and the drain region is formed by doping the source drain regions with a dopant.

A gate insulating film 213 is formed on the active layer 221. The gate insulating film 213 is formed to insulate the active layer 221 from a gate electrode 222, and may be formed of an inorganic material, such as SiNx or $SiO_2$.

The gate electrode 222 is formed in on an upper surface of the gate insulating film 213. The gate electrode 222 is connected to a gate line (not shown) via which an On/Off signal is applied to a thin film transistor (TFT).

The gate electrode 222 may include, for example, at least one metallic material such as Au, Ag, Cu, Ni, Pt, Pd, Al, and Mo, and may include an alloy, such as Al:Nd or Mo:W. However, the gate electrode 222 may be formed of other materials in consideration of design conditions.

An interlayer insulating layer 214 formed on the gate electrode 222 is formed to insulate between the gate electrode 222 and source and drain electrodes 223 and may be formed of an inorganic material, such as SiNx or $SiO_2$.

The source and drain electrodes 223 are formed on the interlayer insulating layer 214. More specifically, contact holes are formed in the interlayer insulating layer 214 and the gate insulating film 213 to expose the source region and the drain region of the active layer 221, and the source and drain electrodes 223 are electrically connected to the exposed source region and the drain region of the active layer 221 through the contact holes.

FIG. 2 depicts a top gate type TFT, which sequentially includes the active layer 221, the gate electrode 222, and the source and drain electrodes 223. However, the TFT may have other structures. For example, the gate electrode 222 may be disposed under the active layer 221.

The organic thin film transistor layer 200a described above is electrically connected to the pixel unit 200b to drive the pixel unit 200b, and is protected by being covered by a planarizing film 215.

The planarizing film 215 may be an inorganic insulating film and/or an organic insulating film. The inorganic insulating film may include, for example, at least one of $SiO_2$, SiNx, SiON, $Al_2O_3$, $TiO_2$, $Ta_2O_5$, $HfO_2$, $ZrO_2$, BST, and PZT. The organic insulating film may include, for example, at least one of a general purpose polymer, such as polymethylmethacrylate (PMMA) or polystyrene (PS), a polymer derivative having a phenol group, an acryl polymer, an imide polymer, an aryl ether polymer, an amide polymer, a fluoride polymer, a p-gilyrene polymer, a vinyl alcohol polymer, and a blend of these materials. Also, the planarizing film 215 may be formed as a complex stacking layer of an inorganic insulating film and an organic insulating film.

The pixel unit 200b is formed on the planarizing film 215. The pixel unit 200b may include a pixel electrode 231, an intermediate layer 232, and a facing electrode 233.

The pixel electrode 231 is formed on the planarizing film 215 and is electrically connected to either the source or drain electrode 223 through a contact hole 230 formed in the planarizing film 215.

The pixel electrode 231 may be a reflection electrode, and in this case, it may include a reflection film including, for example, at least one of Ag, Mg, Al, Pt, Pd, Au, Ni, Nd, Ir, Cr, and a compound of these materials, as well as a transparent or semitransparent electrode formed on the reflection film. The transparent or semitransparent electrode may include, for example, at least one of indium tin oxide (ITO), indium zinc oxide (IZO), zinc oxide (ZnO), indium oxide (In$_2$O$_3$), indium gallium oxide (IGO), and aluminum zinc oxide (AZO).

The facing electrode 233 facing the pixel electrode 231 may be a transparent or semitransparent electrode, and may be formed of a metal thin film having a small work function. The metal thin film may include, for example, at least one of Li, Ca, LiF/Ca, LiF/Al, Al, Ag, Mg, and a compound of these materials. Also, an auxiliary electrode layer or a bus electrode that is formed of a material used to form a transparent electrode, for example, ITO, IZO, ZnO, or In$_2$O$_3$, may further be formed on the metal thin film.

Accordingly, the facing electrode 233 may transmit light emitted from an organic light-emitting layer (not shown) included in the intermediate layer 232. That is, light emitted from the organic light-emitting layer may be directly discharged towards the facing electrode 233 or by being reflected by the pixel electrode 231 that is formed as a reflection electrode.

The organic light-emitting display apparatus 10 may have other configurations. For example, the organic light-emitting display apparatus 10 may be a bottom emission type organic light-emitting display apparatus in which light is discharged towards the substrate 100. When the organic light-emitting display apparatus 10 is a bottom emission type, the pixel electrode 231 may be formed as a transparent or semitransparent electrode, and the facing electrode 233 may be formed as a reflection electrode. Also, the organic light-emitting display apparatus 10 may be a dual light-emitting display apparatus in which light is emitted in both top and bottom directions.

A pixel-defining film 216 is formed on the pixel electrode 231 using an insulating material. The pixel-defining film 216 may include, for example, at least one of polyimide, polyamide, acryl resin, benzocyclobutene, and phenol resin by using a spin coating method. The pixel-defining film 216 exposes a portion of the pixel electrode 231, and the intermediate layer 232, which includes the organic light-emitting layer, is located on the exposed portion of the pixel electrode 231.

The organic light-emitting layer (not shown) included in the intermediate layer 232 may be formed of a low molecular weight organic material or a polymer organic material. The intermediate layer 232 may further optionally include functional layers, such as a hole transport layer (HTL), a hole injection layer (HIL), an electron transport layer (ETL), and an electron injection layer (EIL), besides the organic light-emitting layer.

The substrate 100, on which the display unit 200 is included, is combined with the encapsulation substrate 400 that is disposed on the display unit 200. The encapsulation substrate 400 may be formed of various materials. For example, the encapsulation substrate 400 may be formed of plastic materials, such as acryl, besides a glass material, and furthermore, may be formed of a metal plate.

The substrate 100 and the encapsulation substrate 400 are combined by using the sealing material 310. The sealing material 310 may be a generally-used material, such as sealing glass frit. The sealing material 310 and the encapsulation substrate 400 block external moisture or air from reaching the display unit 200.

A moisture absorbent 320 may further be disposed on a side of the sealing material 310. The moisture absorbent 320 readily reacts with moisture and oxygen, and thus, prevents reduction of the OLED's lifetime due to the moisture and oxygen. The moisture absorbent 320 may include, for example, at least one of an alkali metal oxide, an alkali-earth metal oxide, a metal halide, lithium sulfate, metal sulphate, metal perchlorate, and one of silica gel and phosphorous pentoxide, or a mixture of these materials. However, the type and location of the moisture absorbent 320 can have various other configurations.

The filling material 500 is included inside the area that is sealed by the sealing material 310. The filling material 500 is included to fill a space between the substrate 100 and the encapsulation substrate 400.

The filling material 500 may include, for example, at least one of an epoxy resin, an acryl resin, silicon, ethylene vinyl acetate (EVA), and polyethylene. The filling material 500 may have a thickness T in a range from about 10 μm to about 30 μm. The filling material 500 may have a thermo-hardening or ultraviolet (UV) ray hardening characteristic, and may include various additives, such as a hardening agent, an antioxidant, and a coupling agent.

Figure 3:
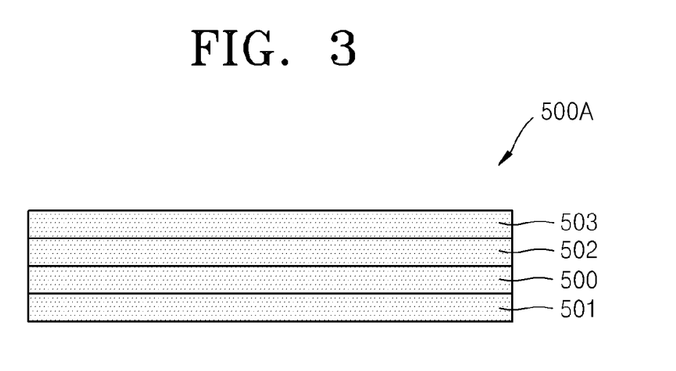
FIG. 3 is a cross-sectional view of a filling film for forming a filling material of the organic light-emitting display apparatus of FIG. 1.

The filling material 500 described above may be formed by using a filling film 500A depicted in FIG. 3. The filling film 500A will now be described in detail with reference to FIG. 3.

FIG. 3 is a cross-sectional view of the filling film 500A for forming the filling material 500 of the organic light-emitting display apparatus 10 of FIG. 1.

Referring to FIG. 3, the filling film 500A may include the filling material 500, a first releasing film 501 attached to a first surface of the filling material 500, a second releasing film 502 attached to a second surface of the filling material 500, and a supporting layer 503 attached on the second releasing film 502.

The filling material 500 may have a thickness in a range from about 10 μm to about 30 μm, and as noted above, may be formed of at least one of an epoxy resin, an acryl resin, silicon, ethylene vinyl acetate (EVA), and polyethylene.

The first and second releasing films 501 and 502 protect the filling material 500 and are separated from the filling material 500 during a manufacturing process of the organic light-emitting display apparatus 10. The first and second releasing films 501 and 502 each may include, for example, at least one of a polymethylpentene film, a polyethylene terephthalate (PET) film, a polytetrafluoroethylene (PTFE, i.e., Teflon® film, and a polypropylene film.

As described below, the first and second releasing films 501 and 502 may be sequentially separated from the filling material 500 during a process of manufacturing the organic light-emitting display apparatus 10. More specifically, according to one exemplary embodiment, the second releasing film 502 may be separated from the filling material 500 before the first releasing film 501 is separated from the filling material 500. Accordingly, in this case, the first releasing film 501 should remain attached to the filling material 500 while the second releasing film 502 is separated. Thus, a bonding force between the first releasing film 501 and the filling material 500 should be greater than the bonding force between the second releasing film 502 and the filling material 500.

For this purpose, the first releasing film 501 may be thicker than the second releasing film 502. For example, the first releasing film 501 may have a thickness in a range from about 50 μm to about 100 μm, and the second releasing film 502 may have a thickness in a range from about 20 μm to about 50 μm. Hence, because the first releasing film 501 is thicker than the second releasing film 502, the bonding force between the first releasing film 501 and the filling material 500 is greater than the bonding force between the second releasing film 502 and the filling material 500, and thus, the process of manufacturing the organic light-emitting display apparatus 10 may be stably performed.

The supporting layer 503 is attached to the second releasing film 502, increases the overall thickness and weight of the filling film 500A, and may prevent the filling film 500A from bending or wrinkling due to a pressure applied to a lateral side of the filling film 500A.

The supporting layer 503 may include, for example, PET, but it is not limited thereto.

The supporting layer 503 is not separated from the second releasing film 502 during the process of manufacturing the organic light-emitting display apparatus 10. Rather, the supporting layer 503 is separated from the filling material 500 together with the second releasing film 502 when the second releasing film 502 is separated from the filling material 500. Accordingly, a bonding force between the supporting layer 503 and the second releasing film 502 should be greater than the bonding force between the second releasing film 502 and the filling material 500.

Figure 5:
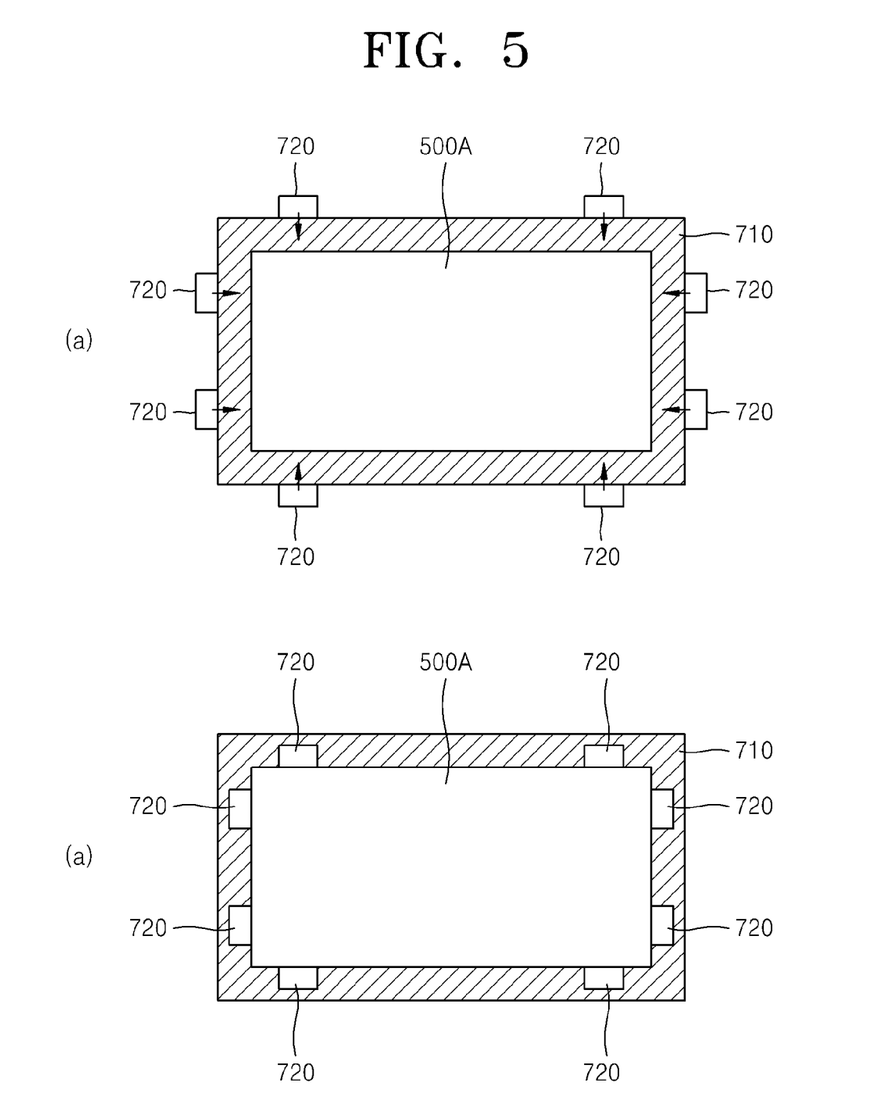

To achieve this greater bonding force, the supporting layer 503 may have a thickness in a range from about 50 μm to about 100 μm. When the supporting layer 503 is less than 50 μm thick, the filling film 500A may be bent or be wrinkled by a centering pin 720 (refer to FIG. 5) in a process of aligning the filling film 500A, as described below with reference to FIG. 5. Also, when the supporting layer 503 is less than 50 μm thick, a bonding force between the supporting layer 503 and the second releasing film 502 is reduced, and thus, the supporting layer 503 may be separated from the second releasing film 502 when the second releasing film 502 is separated from the filling material 500, thereby reducing the efficiency of manufacturing the organic light-emitting display apparatus 10.

Figure 4:
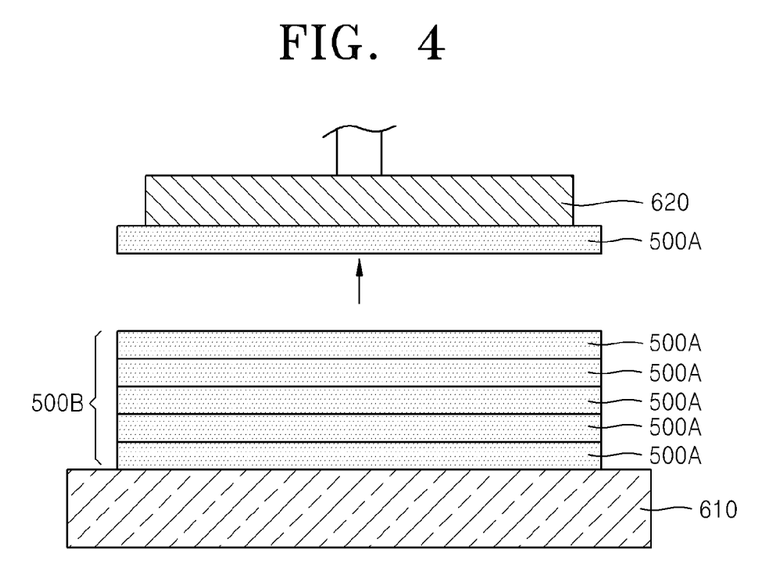
FIG. 4, FIG. 5A, FIG. 5B, FIG. 6, and FIG. 7 are schematic cross-sectional views illustrating a method of manufacturing the organic light-emitting display apparatus of FIG. 1.

When the supporting layer 503 is more than 100 μm thick, the weight of the filling film 500A is excessively increased, and as a result, the filling film 500A may not be lifted by a pick-up unit 620 (refer to FIG. 4). Accordingly, the supporting layer 503 may have a thickness in a range from about 50 μm to about 100 μm.

An upper surface of the supporting layer 503 may be static shielded. The static shielding may be obtained by coating an anti-static agent on the upper surface of the supporting layer 503. Other methods may be used to obtain the static-shielding. For example, the static shielding may be achieved when the supporting layer 503 includes an anti-static agent.

In this way, when the upper surface of the supporting layer 503 is static shielded, as depicted in FIG. 4, when a layer stack 500B is formed by stacking a plurality of filling films 500A, the action of electrostatic force between the filling films 500A may be prevented. Thus, the pick-up unit 620 (refer to FIG. 4) may easily lift the filling films 500A sheet-by-sheet.

FIGS. 4 through 7 are schematic cross-sectional views illustrating a method of manufacturing the organic light-emitting display apparatus 10 of FIG. 1. Although the method described below relates to the manufacture of an organic light-emitting display apparatus, exemplary embodiments of the present invention may be applied to any display apparatus or light emitter that is sealed for its protection, such as protection from impact, air, or moisture.

The method of manufacturing the organic light-emitting display apparatus 10, according to an exemplary embodiment of the present invention, includes: separating the filling films 500A sheet-by-sheet from the layer stack 500B; aligning a separated filling film 500A on the center of a film stage 710; laminating the filling material 500 of the aligned filling film 500A with the encapsulation substrate 400; and combining the substrate 100 on which the display unit 200 is formed with the encapsulation substrate 400.

Hereinafter, the method of manufacturing the organic light-emitting display apparatus 10 will now be described in detail with reference to FIG. 3 and FIGS. 4 through 7.

The separating of the filling films 500A sheet-by-sheet from the layer stack 500B includes, as depicted in FIG. 4, lifting the filling films 500A sheet-by-sheet from the layer stack 500B, which is formed by stacking a plurality of the filling films 500A, by the pick-up unit 620.

The pick-up unit 620 includes a vacuum pad (not shown), and the vacuum pad lifts the uppermost filling film 500A of the layer stack 500B by a vacuum force after the vacuum pad contacts an upper surface of the layer stack 500B. In some exemplary embodiments, due to the vacuum force, the pick-up unit 620 may lift the uppermost filling film 500A without actually contacting the uppermost filling film 500A.

Stacked filling films may generate static electricity due to friction. An electrostatic force may act between the two filling films that contact each other, and thus, the filling films may not be easily separated sheet-by-sheet. When two sheets of the filling films are simultaneously lifted and enter to a centering process like that depicted in FIG. 5, an error may occur in the process of manufacturing the organic light-emitting display apparatus 10, thereby reducing manufacturing efficiency.

However, according to the exemplary embodiments of the present invention, since the filling film 500A further includes the supporting layer 503 besides the filling material 500 and the first and second releasing films 501 and 502 attached to both surfaces of the filling material 500, an overall weight of the filling film 500A may be increased. Accordingly, the filling films 500A may be readily lifted sheet-by-sheet by the pick-up unit 620. Also, the pick-up unit 620 may perform a shaking operation at least once while lifting the filling films 500A. Due to the detaching operation of the pick-up unit 620, even if two or more sheets of the filling films 500A are lifted, the filling films 500A may be readily separated sheet-by-sheet due to the increased weight by the supporting layer 503.

Also, according to the exemplary embodiments of the present invention, the upper surface of the supporting layer 503 may be static shielded. Thus, the generation of static electricity between the stacked filling films 500A may be prevented or reduced. Accordingly, the separation operation of the filling films 500A may be effectively performed. In other words, the filling films 500A may be more easily picked up on a sheet-by-sheet basis, and in the case that two or more filling films 500A are picked up, they may be more readily separated due to the shaking operation of the pick-up unit 620, thereby leaving a single filling film 500A attached to the pick-up unit 620.

Table 1 summarizes success rates of the separation operations. Here, "success" means that a single filling film 500A was initially picked up by the pick-up unit 620, or in the case that two or more filling films 500A were picked up, the shaking operation of the pick-up unit 620 resulted in leaving a single filling film 500A attached to the pick-up unit 620. In the comparative example, the filling film 500A includes the filling material 500, the first releasing film 501, and the second releasing film 502, but does not include the supporting layer 503. However, in embodiments 1 and 2, the filling film 500A additionally includes the supporting layer 503. Also, unlike embodiment 1, in embodiment 2, the upper surface of the supporting layer 503 is static shielded. The filling film 500A includes the filling material 500 having a thickness of 20 μm, the first releasing film 501 having a thickness of 100 μm, and the second releasing film 502 having a thickness of 25 μm. The supporting layer 503 has a thickness of 100 μM.

TABLE 1

|  | Success rate |
| --- | --- |
| Comparative example | 50% |
| Embodiment 1 | 95% |
| Embodiment 2 | 100% |

Next, as depicted in FIG. 5, a separated filling film 500A is aligned on the film stage 710.

More specifically, when a filling film 500A is placed on the film stage 710, the filling film 500A is aligned by centering pins 720 that move from an edge unit of the film stage 710 to contact side surfaces of the filling film 500A. The aligned filling film 500A may be adsorbed by and fixed on vacuum holes formed on a surface of the film stage 710.

The centering pins 720 apply forces on the four sides of the filling film 500A. At this point, if the filling film 500A has a very small thickness, the filling film 500A may bend or be wrinkled due to the pressure applied by the centering pins 720. In this case, the filling film 500A may not be aligned well and may cause an error in a subsequent process.

However, according to exemplary embodiments of the present invention, since the filling film 500A further includes the supporting layer 503 besides the filling material 500 and the first and second releasing films 501 and 502 that are attached to both sides of the filling material 500, the thickness of the filling film 500A is increased. Therefore, the bending or wrinkling of the filling film 500A due to the pressure applied to side surfaces of the filling film 500A by the centering pins 720 may be prevented.

Table 2 summarizes success rates of the centering operations. Here, "success" means that the filling film 500A was not bent or wrinkled enough to cause an error in a subsequent process. In the comparative example, like the comparative example above, the filling film 500A does not include the supporting layer 503. However, in the embodiment, the filling film 500A includes the supporting layer 503. Also, the filling films 500A used in the comparative example and embodiment were the same filling films 500A used in the separation operations of Table 1.

TABLE 2

|  | Success rate |
| --- | --- |
| Comparative example | 70% |
| Embodiment | 90% or more |

As it is seen from Tables 1 and 2, in the case of the filling film 500A that includes the supporting layer 503, success rates of more than 90% are achieved, that is, the occurrence of errors may be reduced at the separation operation and the centering operation in a process of manufacturing the organic light-emitting display apparatus 10. Thus, the manufacturing efficiency of the organic light-emitting display apparatus 10 may be increased.

Figure 6:
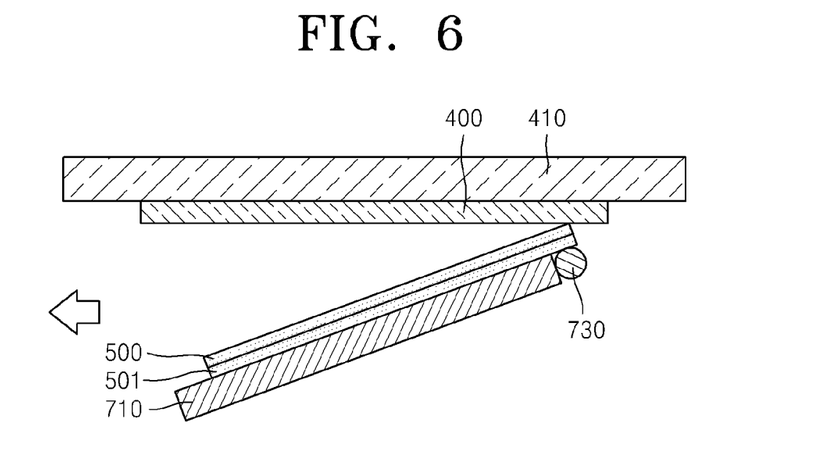

Next, as depicted in FIG. 6, the filling material 500 of the filling film 500A may be disposed on the encapsulation substrate 400. For example, the filling material 500 may be laminated with the encapsulation substrate 400.

The encapsulation substrate 400 is fixed on a substrate stage 410, and the encapsulation substrate 400 may be disposed to face the ground. The substrate stage 410 may be fixed with the encapsulation substrate 400 by adsorbing the encapsulation substrate 400 by a vacuum.

In the filling film 500A aligned on the film stage 710, the supporting layer 503 and the second releasing film 502 are separated from the filling material 500, and the exposed filling material 500 is disposed to face the encapsulation substrate 400. Also, the first releasing film 501 is maintained in a combined state with the filling material 500. For this purpose, a bonding force between the supporting layer 503 and the second releasing film 502 is greater than the bonding force between the second releasing film 502 and the filling material 500, and a bonding force between the first releasing film 501 and the filling material 500 is greater than the bonding force between the second releasing film 502 and the filling material 500.

The lamination of the encapsulation substrate 400 with the filling material 500 may be performed by rotatably moving a roller 730 included on a side of the film stage 710 in a direction. That is, the lamination may be performed in a direction indicated by an arrow in FIG. 6 from a point that contacts the encapsulation substrate 400 as a starting point at a side of the filling material 500.

The first releasing film 501 may be removed after the filling material 500 is laminated on a surface of the encapsulation substrate 400.

Figure 7:
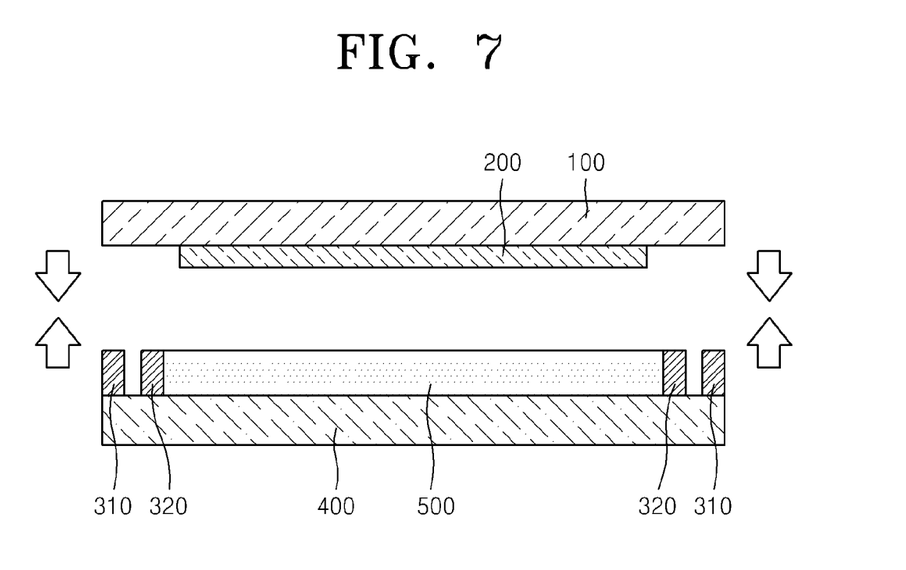

Finally, as depicted in FIG. 7, the encapsulation substrate 400 and the substrate 100 on which the display unit 200 is formed are combined by using the sealing material 310 as a medium.

The display unit 200 is described with reference to FIG. 2. However, various organic light-emitting displays that are well known in the art may be applied to the current embodiment, and thus, descriptions of practical methods of manufacturing the organic light-emitting displays are omitted.

The sealing material 310 may be formed to surround the filling material 500 on the encapsulation substrate 400. The sealing material 310 may be formed by coating a liquid or paste sealing material. In FIG. 7, it is depicted that the sealing material 310 is formed on a surface of the encapsulation substrate 400, but other configurations are possible. For example, the sealing material 310 may be formed on a surface of the substrate 100. Also, the moisture absorbent 320 may further be formed on an inner side of the sealing material 310. For example, the moisture absorbent 320 may be formed by coating a liquid moisture absorbent 320.

The combination of the substrate 100 and the encapsulation substrate 400 is performed such that, after separating the first releasing film 501 from the filling material 500, the substrate 100 is disposed to face the encapsulation substrate 400, and afterwards, the substrate 100 and the encapsulation substrate 400 are combined by irradiating ultraviolet (UV) rays onto the substrate 100 that corresponds to the sealing material 310 and the encapsulation substrate 400 in a vacuum state. When the combination operation is performed in a vacuum state, the penetration of external moisture and foreign materials may be reduced.

Also, when UV rays are irradiated onto the substrate 100 and the encapsulation substrate 400, portions of the substrate 100 and the encapsulation substrate 400 that contact the sealing material 310 melt, and thus, the substrate 100 and the encapsulation substrate 400 may be adhered. However, this is merely an exemplary embodiment, and the substrate 100 and the encapsulation substrate 400 may be adhered in various ways according to the kinds of the sealing material 310.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A filling film, comprising:
   a filling material having a thickness of 10 μm to 30 μm;
   a first releasing film attached to a first surface of the filling material and having a thickness of 50 μm to 100 μm;
   a second releasing film attached to a second surface of the filling material and having a thickness of 20 μm to 50 μm; and
   a supporting layer attached to the second releasing film and having a thickness of 50 μm to 100 μm,
   wherein the first releasing film comprises at least one of a polymethylpentene film, a polyethylene terephthalate film, a polytetrafluoroethylene (PTFE) film, and a polypropylene film, and the second releasing film comprises at least one of a polymethylpentene film, a polyethylene terephthalate film, a PTFE film, and a polypropylene film,
   wherein a thickness of the first releasing film is greater than a thickness of the second releasing film, a bonding force between the first releasing film and the filling material is greater than a bonding force between the second releasing film and the filling material, and
   wherein a bonding force between the second releasing film and the supporting layer is greater than a bonding force between the filling material and the second releasing film such that the supporting layer is separated from the filing material together with the second releasing film.

2. The filling film of claim 1, wherein the supporting layer comprises polyethylene terephthalate.

3. The filling film of claim 1, wherein an outer surface of the supporting layer opposite the second releasing film is coated with an anti-static agent.

4. The filling film of claim 1, wherein:
   the first releasing film is 100 μm thick;
   the filling material is 20 μm thick;
   the second releasing film is 25 μm thick; and
   the supporting layer is 100 μm thick.

5. A filling film, comprising:
   a first releasing film having a first thickness of 50 μm to 100 μm;
   a filling material disposed on the first releasing film and having a thickness of 10 μm to 30 μm;
   a second releasing film disposed on the filling material and having a second thickness of 20 μm to 50 μm, the second thickness being less than the first thickness; and
   a supporting layer disposed on the second releasing film, the supporting layer comprising polyethylene terephthalate and having a third thickness of 50 μm to 100 μm, the third thickness being greater than the second thickness,
   wherein a bonding force between the first releasing film and the filling material is greater than a bonding force between the second releasing film and the filling material,
   wherein a bonding force between the second releasing film and the supporting layer is greater than a bonding force between the filing material and the second releasing film such that the supporting layer is separated from the filing material together with the second releasing film, and
   wherein the first releasing film comprises at least one of a polymethylpentene film, a polyethylene terephthalate film, a polytetrafluoroethylene (PTFE) film, and a polypropylene film, and the second releasing film comprises at least one of a polymethylpentene film, a polyethylene terephthalate film, a PTFE film, and a polypropylene film.

6. The filling film of claim 5, wherein:
   an outer surface of the supporting layer opposite the second releasing film is coated with an anti-static agent, and
   the first thickness and the third thickness both equal 100 μm.

7. The filling film of claim 5, wherein:
   the first releasing film is 100 μm thick;
   the filling material is 20 μm thick;
   the second releasing film is 25 μm thick; and
   the supporting layer is 100 μm thick.

* * * * *